United States Patent [19]

Veldkamp

[11] Patent Number: 4,994,664
[45] Date of Patent: Feb. 19, 1991

[54] OPTICALLY COUPLED FOCAL PLANE ARRAYS USING LENSLETS AND MULTIPLEXERS

[75] Inventor: Wilfrid B. Veldkamp, Lexington, Mass.

[73] Assignee: Massachusetts Institute of Technology, Cambridge, Mass.

[21] Appl. No.: 328,626

[22] Filed: Mar. 27, 1989

[51] Int. Cl.$^5$ .............................................. H01J 3/14
[52] U.S. Cl. .................................. 250/216; 250/208.2; 350/162.16
[58] Field of Search ...................... 350/162.16, 162.21; 250/578, 216, 208.2

[56] References Cited

U.S. PATENT DOCUMENTS

| | | | |
|---|---|---|---|
| 3,746,454 | 7/1973 | Pace et al. | 356/152 |
| 4,410,804 | 10/1983 | Stauffer | 250/578 |
| 4,644,148 | 2/1987 | Kussaka et al. | 250/201 |
| 4,649,351 | 3/1987 | Veldkamp et al. | 350/4.3 |
| 4,708,436 | 11/1987 | Kleinknecht | 350/162.17 |
| 4,878,735 | 11/1989 | Vilums | 350/131 |

OTHER PUBLICATIONS

Mead et al., "A Silicon Model of Early Visual Processing," *Neural Networks*, vol. 1, 1988, pp. 91-97.
Veldkamp et al., "High Efficiency Binary Lenses," *Optics Communications*, vol. 53, No. 6, Apr. 15, 1985, pp. 353-359.
Veldkamp, U.S. patent application Ser. No. 099,307, filed Sep. 21, 1987, entitled High-Efficiency, Multilevel, Diffractive Optical Elements.

*Primary Examiner*—David C. Nelms
*Attorney, Agent, or Firm*—Choate, Hall & Stewart

[57] ABSTRACT

A detector array including a substrate having an array of diffractive lenses formed on the top side of the substrate and an array of sensor elements formed on the backside of the substrate. The sensor elements within the sensor array are oriented on the backside so that each sensor is aligned to receive light from a corresponding diffractive lens of the lens array. The detector array may also include a second substrate having an array of diffractive elements formed on one of its surfaces, the second substrate being disposed above and in proximity to the top side of the other substrate so that the elements on the second substrate are substantially aligned with corresponding sensor elements and diffractive lenses on the other substrate.

11 Claims, 2 Drawing Sheets

OPTICALLY COUPLED FOCAL PLANE ARRAYS USING LENSLETS AND MULTIPLEXERS

The Government has rights in this invention pursuant to Contract Number F19628-85-C-0002 awarded by the Department of the Air Force.

BACKGROUND OF THE INVENTION

This to two dimensional detector arrays.

Two dimensional detector arrays are finding an increasing number of applications in the field of image processing. A typical two dimensional array consists of a densely packed collection of sensor elements, such as CCD's, organized into a matrix of rows and columns which are generally arranged on a plane. In some applications, a system of lenses projects a target image onto the array. In such cases, each sensor within the array represents a pixel, which is a single small element of the image that is being projected onto the array. That is, the sensor receives the light from the small area of the image and generates a signal which is proportional to the average amount of light in that area. Together, the signals from all of the sensors describe the image.

Of course, the radiation which is being detected need not be visible light. Imaging systems also process other forms of electromagnetic energy such as infrared radiation. Nevertheless, the concerns and considerations relating to the visible light detecting circuits usually also apply to the other forms of energy. The level of detail achievable with a detector array depends, of course, on the size and spacing of the sensor elements. If each sensor element is very small and is closely spaced to its neighboring elements, then the level of detail achievable in the generated image signal should be high. On the other hand, if the individual sensor elements are large or are widely spaced from each other, the resulting detail in the image signal will be lower. Thus, the amount of open space between the sensor elements is a key consideration in designing the array.

The phrase frequently used to characterize the percentage of area which is occupied by the sensor elements is fill factor. A fill factor of 1.0 means that no dead space exists between the sensor elements within the array, while a fill factor of 0.25 means that one quarter of the area of the array is occupied by the sensor elements and the remaining three quarters of the area is open. As a rule, arrays with low fill factors allow a large percentage of the light impacting the matrix to be wasted. That is, light falls onto dead space, which is the open area of the array outside of the area of the sensing elements. Thus, light signal energy is lost and the light gathering efficiency of the array is correspondingly low. Moreover, the image which falls in the open areas is essentially obscured from view by the sensing elements.

Under conventional ways of fabricating the detector arrays, however, there is a price to be paid for constructing an array having a high fill factor to achieve either a high efficiency or a high resolution. As the spacing between the sensor elements in the plane of the array is reduced, so too is the amount of space available for the wires or metalizations needed to interconnect the sensors. If the space is reduced too much, the interconnections must be made off of the plane of the array, which greatly increases the complexity of fabricating the array and of connecting it to the external circuitry which processes the image signals. Furthermore, with recent developments in parallel processing, cellular automata, neural networks and circuit simulation of biological networks, a greater premium is being placed on the space between the sensors since the complexity of the sensor interconnections is significantly increasing. Associative circuitry which implements communication and feedback within groups and between groups of sensors is a key design objective in these newer technologies. Consequently, the details of the interconnections are becoming more and more complex. Moreover, it is also becoming increasingly desirable to bring the interconnecting circuitry closer to the groups of sensors which are operating associatively rather than have the interconnections located off of the wafer or the substrate containing the sensors.

SUMMARY OF THE INVENTION

The invention is a detector array which comprises a substrate including an array of diffractive lenses which is formed on the top side of the substrate and an array of sensor elements which is formed on the back side of the substrate. The sensor elements within the sensor array are oriented on the back side so that each sensor element is aligned to receive light from a corresponding diffractive lens of the lens array.

Preferred embodiments include the following features. The substrate is a semiconductor and the sensor elements are charge-coupled detectors. Also each lens in the array is a binary diffractive lens having a focal length which is approximately equal to the thickness of the substrate. In addition, the lens array has a fill factor which is approximately equal to one while the sensor array has a fill factor which is substantially less than one.

In another embodiment of the invention, the detector array further comprises a second substrate having an array of diffractive elements formed on one of its surfaces. The second substrate is disposed above and in proximity to the top side of the other substrate so that the diffractive elements on the second substrate are substantially aligned with corresponding sensor elements and diffractive lenses on the other substrate.

In a preferred embodiment, the diffractive elements are wavefront multiplexers.

One advantage of the invention is that small spread apart sensor elements resulting in a low fill factor can be utilized on one side of the substrate without compromising the energy gathering efficiency or detail resolution of the detector array. The electromagnetic radiation falling onto the lens array on the top side of the substrate containing the sensor elements is focused onto the significantly smaller areas of the sensor elements, thereby leaving considerable open space surrounding the sensor elements for such uses as focal plane processing of the image signals generated by the sensor elements. Moreover, by utilizing multiple levels of lens arrays, the optical part of the detector array can be utilized to achieve image signal feedback coupling which is useful in some neural networks thereby reducing the corrections required on the focal plane.

The invention is referred to as an amacronic sensor. Amacronics derives its name from layered "a-macros" or "short-range" interacting networks observed in front of mammalian retinas. Retinal amacrine network functions are motion detection, edge enhancement and image noise reduction.

DETAILED DESCRIPTION OF THE PREFERRED EMBODIMENTS

Figure 1:
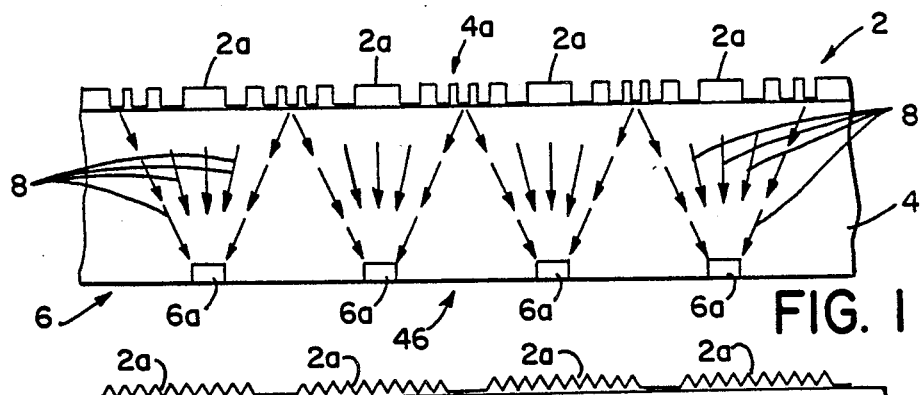
FIG. 1 is a cross-sectional view of an embodiment of the invention.
Figure 2:
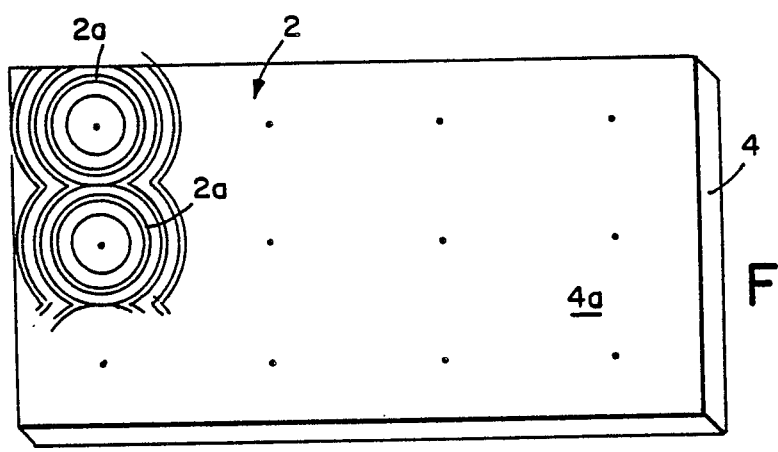
FIG. 2 illustrates the top side of the structure shown in FIG. 1.
Figure 3:
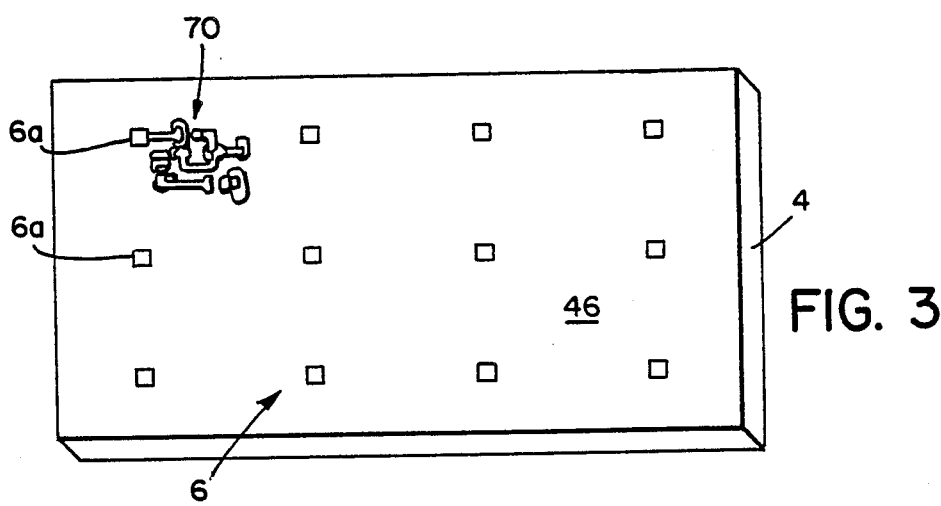
FIG. 3 illustrates the back side of the structure shown in FIG. 1.

As shown in FIG. 1 an embodiment of the invention comprises an array 2 of diffractive lenses 2a which is formed on the top side 4a of a substrate 4 and an array 6 of sensor elements 6a which is disposed on the back side 4b of the substrate 4. The array 2, which is more clearly illustrated in FIG. 2, consists of a plurality of lenses 2a which are distributed over the top side 4a in orthogonal columns and rows. Each of the lenses 2a is constructed so that the aperture of the lens covers most, if not all, of the available surface area thereby yielding a fill factor near 1. The array 6, which is more clearly illustrated in FIG. 3, consists of a plurality of sensor elements 6a which are distributed over the back side 4b also in orthogonal rows and columns. The dimensions of each sensor element 6a is significantly less than the separation between the sensor elements 6a. Therefore, the array 6 has a fill factor which is significantly less than 1. In addition, the shape and size of the array 6 is the same as the shape and size of the array 2. Moreover, the array 2 and the array 6 are oriented on their respective sides of the substrate 4 so that each lens 2a is opposite to and aligned with a corresponding sensor element 6a in the second array 6.

The particular shape of the lens 2a which is used depends in part upon the desired distribution pattern for the sensor elements 6a. In this embodiment, the sensor elements 6a are distributed on the back side 4b in equally spaced rows and columns; therefore, a square lens achieves good coverage of the available surface area on top side 4a. If the distribution pattern of the sensor elements 6a were different, other shaped lenses might be more desirable.

Again referring to FIG. 1, each lens 2a is designed and constructed to have a focal length which is approximately equal to the thickness of the substrate 4. Thus, the electromagnetic radiation captured by a lens 2a is focused onto its corresponding sensor element 6a located on the back side 4b. This is shown diagrammatically with the aid of arrows 8. For methods of designing and constructing a binary diffractive lens with a desired focal length and optical characteristics refer to W. B. Veldkamp et al., "High Efficiency Binary Lenses," *Optics Communications*, Vol. 53, No. 6, Apr. 15, 1985 and U.S. patent application Ser. No. 099,307 entitled "High Efficiency, Multilevel, Diffractive Optical Elements" filed 9/21/87, now U.S. Pat. No. 4,895,790 which are incorporated herein by reference.

The diffractive lens 2a can be designed to focus the captured radiation so that a sensor element 6a which has less than 5 percent of the total area of the lens 2a is large enough to capture the focused radiation. Consequently, very small sensor elements 6a can be used thereby freeing up most of the area on the back side 4b for alternative uses, some of which will be described shortly.

The substrate 4 is composed of a material which is transparent to the particular electromagnetic radiation of interest. For example, if the radiation lies in the infrared region, the material may be either silicon or germanium. If, on the other hand, the radiation is visible light, an appropriate material might be quartz or $SiO_2$. The sensor elements 6a may be selected from a number of different alternatives depending upon the application and the desired performance characteristics. Examples of appropriate sensor elements are charge-coupled devices (CCD's) and Schottky platinum silicide devices. Finally, the lenses 2a may be formed in the surface of the first substrate material itself or in a layer, such as an oxide, which is on the top side 4a.

A detector array which is useful in the infrared region can be fabricated as follows. A silicon wafer which has had both of its surfaces polished is used as the substrate 4. Using an etch mask and standard photolithographic technique, the array of lenses is formed on the top side 4a of the silicon material. After the lens array is has been generated, conventional integrated circuit fabrication techniques are used to fabricate an array of CCD's on the back side 4b. The array of lenses can be properly aligned with the array of CCD's, which was formed on the back side 4b, with the aid of infrared light. While the etch mask for generating the lens array is held above the top side 4a of the wafer, infrared light is shined through the mask to produce an image on the back side 4b of the wafer consisting of an array of dots, which are, of course, observed using an infrared imaging system. The alignment could also take place with lithographically placed fudicial marks on both sides of the substrate. The lens mask is then rotated until the pattern of dots aligns with the pattern of CCD's. After the lens array has been properly oriented and the lenses have been etched into the top side of the wafer, metalization is deposited on the back side 4b to interconnect the sensor elements 6a and to provide a means for connecting them to external circuitry. The precise details of the steps in each of these stages of the process are known to those skilled in the art.

The open space between the sensor elements 6a can be used for focal plane processing of the image signals which are generated by the sensor elements 6a. In other words, signal processing circuitry 10 (see FIG. 3) which processes the image signals from the sensor elements 6a can be fabricated on the back side 4b using integrated circuit technology. Thus, massively parallel, short range, feed-forward and feedback interactions which characterize the neural adaptive linear networks and biological networks can be more easily and effectively realized using these detector arrays.

Figure 4:
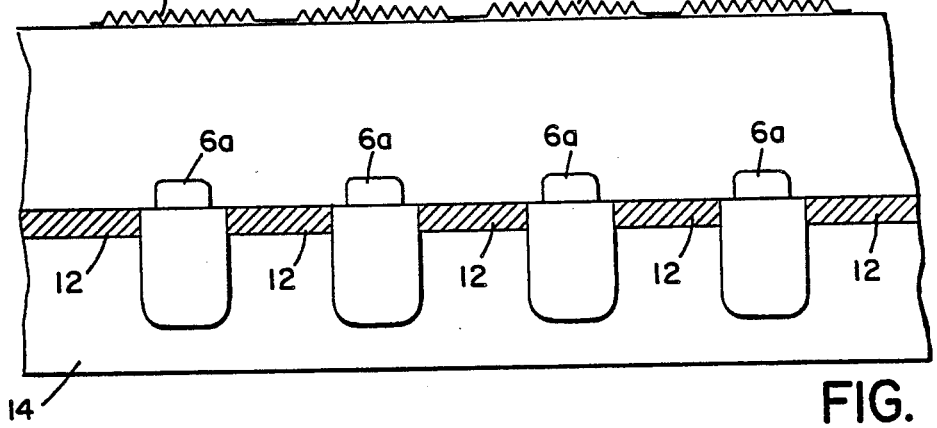
FIG. 4 illustrates an alternative embodiment of the invention.

In other applications, the open space between the sensor elements 6a has different functions. For example, some infrared detector arrays receive high amounts of signal energy and thus, must be equipped with heat dissipation systems to prevent the thermal destruction of the detector. With little space between the sensor elements in conventionally designed detector arrays, providing effective heat dissipation can be very difficult. A detector array which embodies the invention, however, is ideally suited for providing effective heat dissipation to the array and for increasing the detector resistance to gamma radiation. The open space between the sensor elements 6a offers a large amount of area which can be used for heat sinking purposes. Thus, as illustrated in FIG. 4, a heat conducting material 12, such as gold or diamond, may be deposited onto the back side 4a in the open space between the sensor elements 6a. Then, the heat conducting material 12 is, in turn, coupled to a heat sink 14.

Figure 5:
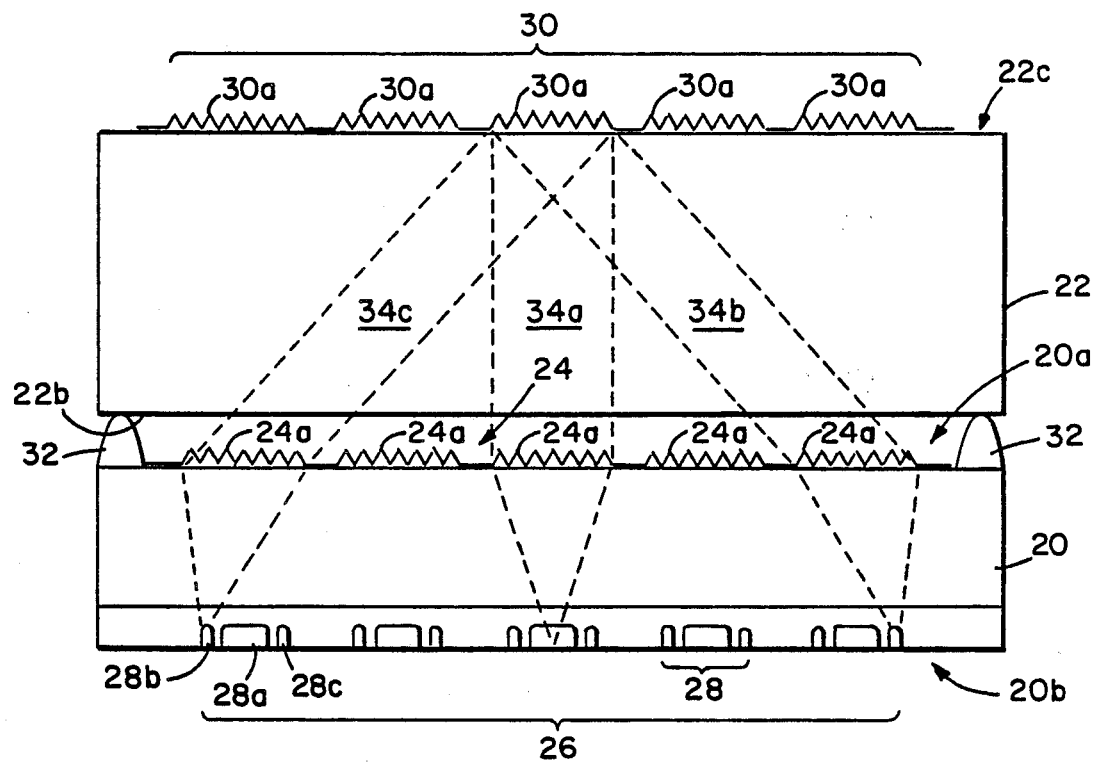
FIG. 5 is a cross-sectional view of yet another embodiment of the invention.

Another embodiment of the invention is illustrated in FIG. 5. As shown, there are two substrates, a first substrate 20 and a second substrate 22. The first substrate 20 has a top side 20a and a back side 20b. On the top side 20a, there is an array 24 of binary diffractive lenses 24a. On the back side 20b, there is an array 26 of sensor clusters 28. As is shown more clearly in FIG. 6, a sensor cluster 28 comprises a central image sensor 28a surrounded by four feedback sensors 28b-e. The second substrate 22 is located above and parallel to the top side 20a of the first substrate 20. On a top surface 22a of the second substrate 22 is an array 30 of diffractive elements 30a. The second substrate 22 rests on a plurality of posts 32 located on the top side 20a of the first substrate 20, which keep it at a fixed distance from the first substrate 20.

The arrays 24, 26 and 30 have the same shape and dimensions and they are oriented with respect to each other so that each sensor cluster 28 in array 26 is in alignment with corresponding elements in arrays 24 and 30.

The lenses 24a are similar in design and construction to the lenses 2a shown in FIG. 1. That is, each of the lenses 24a is a binary diffractive lens which has a focal length that is approximately equal to the thickness of substrate 20 and each one serves to focus light impacting on the top side 20a of substrate 20 onto a single corresponding sensor cluster 28. Diffractive elements 30a, on the other hand, are binary diffractive wavefront multiplexers which convert the light wavefront impacting on the top side 22a of the second substrate 22 into several beams with controlled intensity ratios. In the embodiment described herein a total of five such beams are employed, namely a central beam 34a and four periphery beams 34b-e (outlined with dashed lines in FIG. 5).

Since FIG. 5 is a cross-sectional view, only three of the five beams 34a-c are shown. The remaining two beams 34d-e lie in a plane which is perpendicular to the plane on which the figure is drawn. Furthermore, although the embodiment concerns a multiplexer which generates five primary beams, certainly a multiplexer which produces more than five primary beams could be used if it was appropriate for the particular application. One method for designing and constructing such binary diffractive multiplexers is described in U.S. Pat. No. 4,649,351, incorporated herein by reference.

Array 30 is positioned above array 24 so that the central beam 34a illuminates a lens 24a which is aligned with a lens 30a and the periphery beams 34b-e illuminate lenses 24a which are all two lenses away from and surround the lens 24a illuminated by the central beam 34a. Of course, the periphery beams can illuminate lenses which are one, two or more lenses away from the lens illuminated by the central beam depending on the spacing between and the design of the arrays 24 and 30. Furthermore, the sensors within the sensor cluster 28 are positioned in the structure so that the central beam 34a illuminates a central sensor 28a and the periphery beams 34b-e illuminate corresponding feedback sensors 28b-e.

Figure 6:
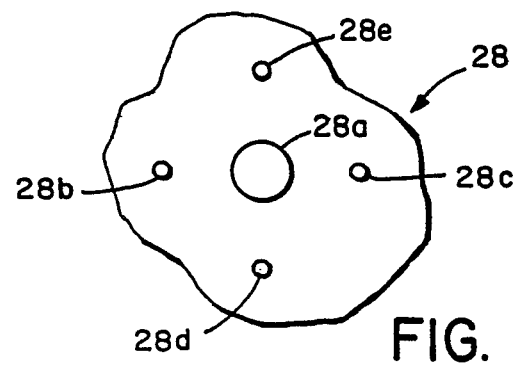
FIG. 6 illustrates the sensor cluster which is shown in FIG. 5.

The embodiment illustrated by FIGS. 5 and 6 is useful for realizing simple neural functions such as a center-surround response and such as others described Carver A. Mead et al. in "A Silicon Model of Early Visual Processing," Neural Networks, Vol. 1, pp. 91-97, 1988, incorporated herein by reference. For example, to implement a center-surround response, the signals from the feedback sensors 28b-e, which represent off-axis optical information, are fed back to the corresponding central sensor 28a so as to provide feedback attenuating the signal from the central sensor 28a.

The foregoing description has been limited to specific embodiments of this invention. It will be apparent, however, that variations and modifications may be made to the invention, with the attainment of some or all of the advantages of the invention. Therefore, it is the object of the appended claims to cover all such variations and modifications as come within the true spirit and scope of the invention.

What is claimed is:

1. A detector array comprising:
   a. a substrate having a top side and a back side;
   b. an array of curvilinear diffractive lenses formed on the top side of the substrate;
   c. an array of sensor elements formed on the back side of the substrate, the sensor elements being disposed so that each sensor is aligned with a corresponding lens within the lens array.

2. The detector array as defined in claim 1, wherein the substrate is a semiconductor and the sensors are semiconductor devices formed within the substrate.

3. The detector array as defined in claim 2, wherein the semiconductor devices are charge-coupled devices.

4. The detector array as defined in claim 1, wherein the first substrate is composed of quartz.

5. The detector array as defined in claim 1, wherein each lens in the array has a focal length which is approximately equal to the thickness of the substrate.

6. The detector array as defined in claim 1, wherein the lens array has a fill factor which is approximately equal to one and the sensor array has a fill factor which is substantially less than one.

7. The detector array as defined in claim 1, wherein the area between the sensor elements on the back side of the substrate includes integrated circuitry adapted for focal plane processing of signals which are generated by the sensors.

8. The detector array as defined in claim 1, wherein the substrate is a semiconductor and the array of diffractive lenses is constructed within an oxide of the semiconductor formed on the top side of the substrate.

9. The detector array as defined in claim 1, wherein the diffractive lenses of the array of diffractive lenses are binary diffractive lenses.

10. The detector array as defined in claim 1 further comprising a second substrate having another array of diffractive elements formed on one of its surfaces, wherein the second substrate is disposed above and in proximity to the top side of the other substrate so that the diffractive elements of the second substrate are substantially aligned with corresponding sensor elements and diffractive lenses of the other substrate.

11. The detector array as defined in claim 10, wherein the diffractive elements on the second substrate are wavefront multiplexers adapted to convert a light wavefront into a plurality of beams with controlled intensity ratios and directed at selected ones of the diffractive lenses on the array.

* * * * *

UNITED STATES PATENT AND TRADEMARK OFFICE
CERTIFICATE OF CORRECTION

PATENT NO. : 4,994,664  
DATED : February 19, 1991  
INVENTOR(S) : Wilfrid B. Veldkamp Page 1 of 2

It is certified that error appears in the above-indentified patent and that said Letters Patent is hereby corrected as shown below:

In the drawings, Sheet 1, Fig. 1, a horizontal line should be drawn across the substrate 4. The line, which was present in the informal Fig. 1 as originally filed, was accidentally deleted in the formal drawing.

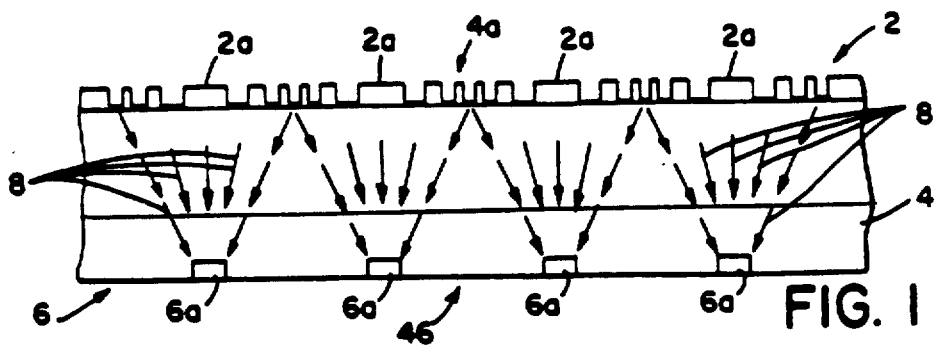

UNITED STATES PATENT AND TRADEMARK OFFICE
CERTIFICATE OF CORRECTION

PATENT NO. : 4,994,664
DATED : February 19, 1991
INVENTOR(S) : Wilfrid B. Veldkamp It is certified that error appears in the above-indentified patent and that said Letters Patent is hereby corrected as shown below:

Column 1, line 10: delete "This to two" and insert therefor -- This invention relates to two --;

Column 6, line 3: after "described" insert -- in --; and

Column 6, line 4: delete "in".

Signed and Sealed this

Twenty-ninth Day of March, 1994

Attest:

BRUCE LEHMAN

Attesting Officer

Commissioner of Patents and Trademarks